(12) United States Patent
Qin et al.

(10) Patent No.: US 11,844,262 B2
(45) Date of Patent: Dec. 12, 2023

(54) UNDER-SCREEN FINGERPRINT RECOGNITION MODULE, DISPLAY ASSEMBLY AND DISPLAY DEVICE

(71) Applicant: BOE TECHNOLOGY GROUP CO., LTD., Beijing (CN)

(72) Inventors: Yunke Qin, Beijing (CN); Lei Wang, Beijing (CN); Lei Zhang, Beijing (CN); Peng Jia, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 137 days.

(21) Appl. No.: 17/419,568

(22) PCT Filed: Sep. 30, 2020

(86) PCT No.: PCT/CN2020/119437
§ 371 (c)(1),
(2) Date: Jun. 29, 2021

(87) PCT Pub. No.: WO2022/067681
PCT Pub. Date: Apr. 7, 2022

(65) Prior Publication Data
US 2022/0320198 A1 Oct. 6, 2022

(51) Int. Cl.
*G06V 40/13* (2022.01)
*H10K 59/65* (2023.01)
(Continued)

(52) U.S. Cl.
CPC ......... *H10K 59/65* (2023.02); *G06V 40/1318* (2022.01); *H10K 59/12* (2023.02); *H01L 27/14623* (2013.01); *H01L 27/14678* (2013.01)

(58) Field of Classification Search
None
See application file for complete search history.

(56) References Cited

U.S. PATENT DOCUMENTS

2018/0307887 A1 10/2018 Han et al.
2020/0012833 A1* 1/2020 Jin ..................... G06V 40/1329
(Continued)

FOREIGN PATENT DOCUMENTS

CN 105975963 A 9/2016
CN 109863506 A 6/2019
(Continued)

*Primary Examiner* — Joseph R Haley
(74) *Attorney, Agent, or Firm* — BROOKS KUSHMAN P.C.

(57) ABSTRACT

The present disclosure provides an under-screen fingerprint recognition module, a display assembly and a display device. The under-screen fingerprint recognition module includes a base substrate and a plurality of fingerprint recognition units arranged on the base substrate. Each fingerprint recognition unit includes a photosensitive unit and an optical structure arranged on a photosensitive surface of the photosensitive unit. The optical structure includes a light-transmitting ring and a light-transmitting hole sequentially arranged in a direction away from the photosensitive unit. An orthogonal projection of the light-transmitting ring onto the photosensitive unit is completely located on the photosensitive surface of the photosensitive unit, and an orthogonal projection of the light-transmitting hole onto the light-transmitting ring is located within an opaque region surrounded by the light-transmitting ring.

15 Claims, 5 Drawing Sheets

(51) Int. Cl.
*H10K 59/12* (2023.01)
*H01L 27/146* (2006.01)

(56) References Cited

U.S. PATENT DOCUMENTS

| | | | |
|---|---|---|---|
| 2020/0234026 | A1 | 7/2020 | Du |
| 2020/0293738 | A1 | 9/2020 | Zhang et al. |
| 2021/0350100 | A1* | 11/2021 | Park .................. G06V 40/1318 |

FOREIGN PATENT DOCUMENTS

| | | |
|---|---|---|
| CN | 110088768 A | 8/2019 |
| CN | 111133445 A | 5/2020 |
| CN | 111653599 A | 9/2020 |
| KR | 101948870 B1 | 2/2019 |

* cited by examiner

ND-SCREEN FINGERPRINT RECOGNITION MODULE, DISPLAY ASSEMBLY AND DISPLAY DEVICE

CROSS-REFERENCE TO RELATED APPLICATION

This application is the U.S. national phase of PCT Application No. PCT/CN2020/119437 filed on Sep. 30, 2020, which is incorporated herein by reference in its entirety.

TECHNICAL FIELD

The present disclosure relates to the field of display technology, in particular to an under-screen fingerprint recognition module, a display assembly and a display device.

BACKGROUND

In an Organic Light-Emitting Diode (OLED) under-screen fingerprint recognition technology, there is an under-screen point light source scheme. In the scheme, an OLED display substrate and an under-screen fingerprint recognition module are independent of each other. A specific light-emitting diode of the OLED display substrate is enabled to be in an on state. Light emitted by the light-emitting diode reaches a finger, and is totally reflected by ridges and valleys of a fingerprint. The totally-reflected light carries information about the ridges and valleys of the fingerprint, and is finally detected by the under-screen fingerprint recognition module to acquire a fingerprint image.

However, for the above structure, ambient light may interfere with the under-screen fingerprint recognition module. The larger the intensity of the ambient light, the greater the interference imposed on the under-screen fingerprint recognition module, and even it is impossible for the under-screen fingerprint recognition module to acquire the fingerprint image.

SUMMARY

An object of the present disclosure is to provide an under-screen fingerprint recognition module, a display assembly and a display device, so as to solve the problem in the related art where the under-screen fingerprint recognition module has a poor imaging effect or it is even unable to acquire an image when ambient light interferes with the under-screen fingerprint recognition module.

In one aspect, the present disclosure provides in some embodiments an under-screen fingerprint recognition module, including a base substrate and a plurality of fingerprint recognition units arranged on the base substrate. Each fingerprint recognition unit includes a photosensitive unit and an optical structure arranged on a photosensitive surface of the photosensitive unit. The optical structure includes a light-transmitting ring and a light-transmitting hole sequentially arranged in a direction away from the photosensitive unit. The light-transmitting ring is formed in a first light-shielding layer, the light-transmitting hole is formed in a second light-shielding layer, an orthogonal projection of the light-transmitting ring onto the photosensitive unit is at least partially located on the photosensitive surface of the photosensitive unit, and an orthogonal projection of the light-transmitting hole onto the light-transmitting ring is located within an opaque region surrounded by the light-transmitting ring.

In a possible embodiment of the present disclosure, an angle formed by a line connecting any point in the light-transmitting hole and any point of the light-transmitting ring and a reference line is within a preset angle range, and the reference line is perpendicular to the base substrate.

In a possible embodiment of the present disclosure, the preset angle range is 40° to 750°.

In a possible embodiment of the present disclosure, the light-transmitting ring and the light-transmitting hole satisfy at least one of the following conditions: a diameter of the light-transmitting hole is within a range of 2 µm to 20 µm, a diameter of an outer ring of the light-transmitting ring is within a range of 12 µm to 300 µm, a diameter of an inner ring of the light-transmitting ring is within a range of 5 µm to 50 µm, and a distance between the light-transmitting ring and the light-transmitting hole is within a range of 2 µm to 50 µm.

In a possible embodiment of the present disclosure, the photosensitive unit includes a first electrode, a photosensitive layer and a second electrode sequentially arranged in a direction away from the base substrate, and the second electrode is a transparent electrode. The under-screen fingerprint recognition module further includes a first insulation layer and a signal line arranged at a side of the second electrode away from the base substrate, the signal line is coupled to the second electrode through a via hole in the first insulation layer, and the first light-shielding layer and the signal line are made of a same material.

In a possible embodiment of the present disclosure, the under-screen fingerprint recognition module further includes a light-transmitting shielding layer arranged at a side of the photosensitive unit away from the base substrate, and the second light-shielding layer is arranged at a side of the light-transmitting shielding layer away from the base substrate.

In a possible embodiment of the present disclosure, the second light-shielding layer is made of a conductive material and is superimposed on the light-transmitting shielding layer.

In a possible embodiment of the present disclosure, the under-screen fingerprint recognition module further includes a second insulation layer arranged between the second light-shielding layer and the light-transmitting shielding layer.

In a possible embodiment of the present disclosure, the optical structure is an independent component attached to the photosensitive surface of the photosensitive unit through an optical clear adhesive, or arranged at a side of the under-screen fingerprint recognition module furthest away from the base substrate.

In a possible embodiment of the present disclosure, each optical structure includes at least a group of light-transmitting rings and light-transmitting holes.

In a possible embodiment of the present disclosure, each group of light-transmitting rings and light-transmitting holes include at least one light-transmitting ring and one light-transmitting hole, and the light-transmitting rings are sequentially arranged in the direction away from the photosensitive unit.

In another aspect, the present disclosure provides in some embodiments a display assembly including a display substrate and the above under-screen fingerprint recognition module. The display substrate includes a plurality of light-emitting units and is arranged at a side of the under-screen fingerprint recognition module away from the base substrate.

In a possible embodiment of the present disclosure, the display substrate is attached to the under-screen fingerprint recognition module.

In yet another aspect, the present disclosure provides in some embodiments a display device including the above display assembly.

According to the embodiments of the present disclosure, signal light at a large angle for fingerprint recognition may be guided by the optical structure toward the photosensitive unit through the light-transmitting hole and the light-transmitting ring, and ambient light at a small angle may pass through the light-transmitting hole and then may be shielded by the opaque region surrounded by the light-transmitting ring. As a result, it is able prevent the ambient light from interfering with the photosensitive unit, thereby to improve the accuracy of the fingerprint recognition.

BRIEF DESCRIPTION OF THE DRAWINGS

Through reading the detailed description hereinafter, the other advantages and benefits will be apparent to a person skilled in the art. The drawings are merely used to show the preferred embodiments, but shall not be construed as limiting the present disclosure. In addition, in the drawings, same reference symbols represent same members. In these drawings.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
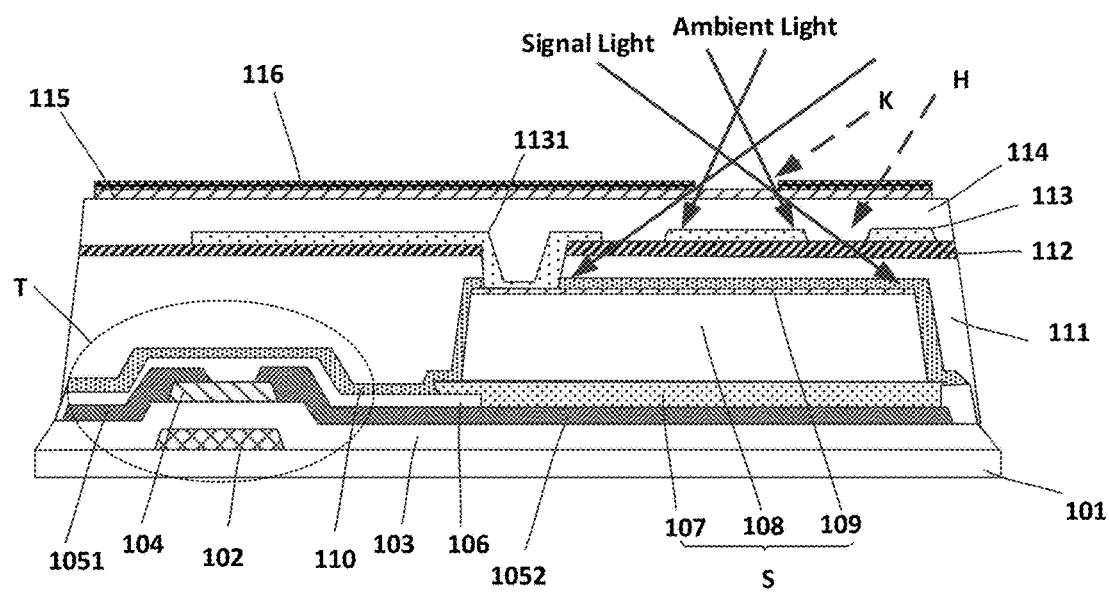
FIG. 1 is a schematic view showing film layers of an under-screen fingerprint recognition module according to one embodiment of the present disclosure.
Figure 2:
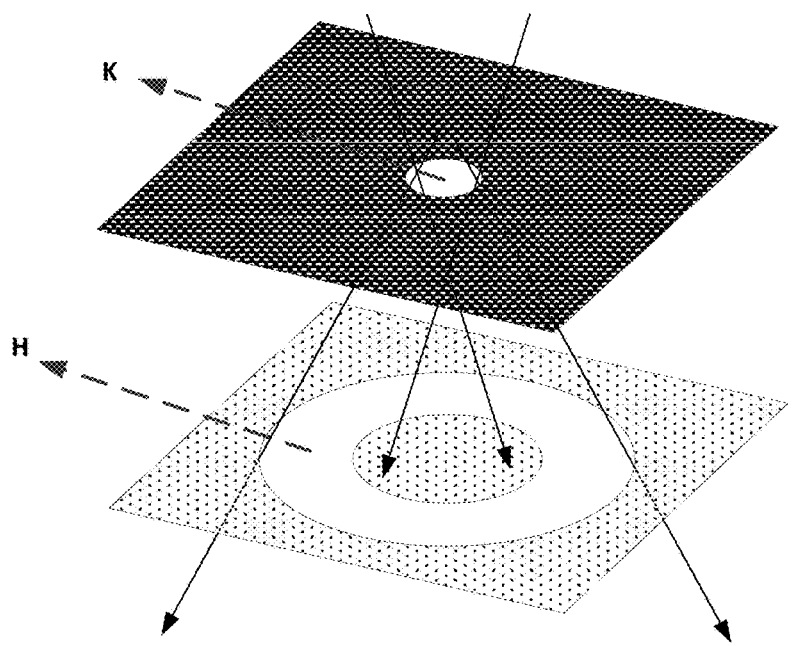
FIG. 2 is a solid view of an optical structure according to one embodiment of the present disclosure.
Figure 3:
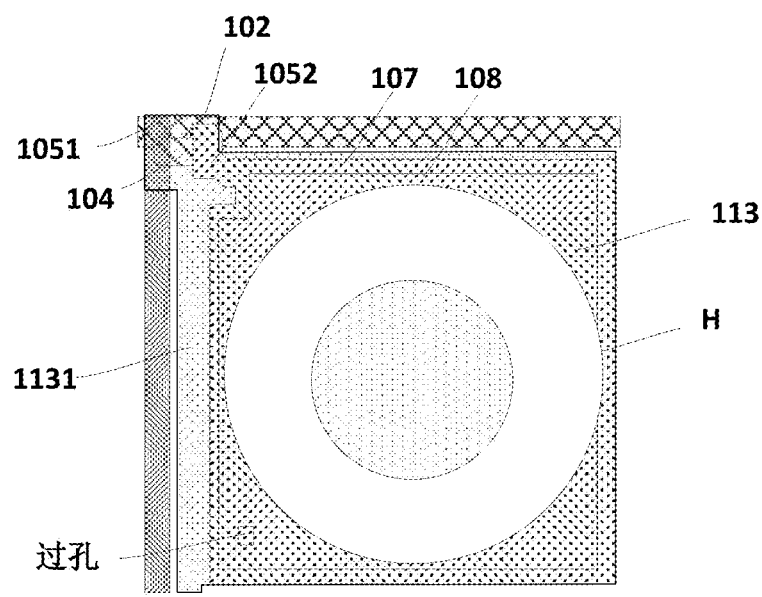
FIG. 3 is a top view of the under-screen fingerprint recognition module according to one embodiment of the present disclosure.

Referring to FIGS. 1, 2 and 3, the present disclosure provides in some embodiments an under-screen fingerprint recognition module, which includes a base substrate 101 and a plurality of fingerprint recognition units arranged on the base substrate 101. Each fingerprint recognition unit includes a photosensitive unit S and an optical structure arranged on a photosensitive surface of the photosensitive unit S. The optical structure includes a light-transmitting ring H and a light-transmitting hole K sequentially arranged in a direction away from the photosensitive unit S. The light-transmitting ring H is formed in a first light-shielding layer 113, and the light-transmitting hole K is formed in a second light-shielding layer 116. An orthogonal projection of the light-transmitting ring H onto the photosensitive unit S is at least partially located on the photosensitive surface of the photosensitive unit S, and an orthogonal projection of the light-transmitting hole K onto the light-transmitting ring H is located within an opaque region surrounded by the light-transmitting ring H. In a possible embodiment of the present disclosure, the orthogonal projection of the light-transmitting ring H onto the photosensitive unit S may be completely located on the photosensitive surface of the photosensitive unit S.

According to the embodiments of the present disclosure, the optical structure including the light-transmitting ring and the light-transmitting hole may be arranged on the photosensitive surface of the photosensitive unit, so as to guide signal line at a large angle (an angle of the signal line relative to a reference line perpendicular to the base substrate) for fingerprint recognition toward the photosensitive surface of the photosensitive unit through the light-transmitting hole and the light-transmitting ring, and ambient light at a small angle may pass through the light-transmitting hole and then may be shielded by the opaque region surrounded by the light-transmitting ring. As a result, it is able to prevent the ambient light from interfering with the photosensitive unit, thereby to improve the accuracy of the fingerprint recognition.

Figure 4A:
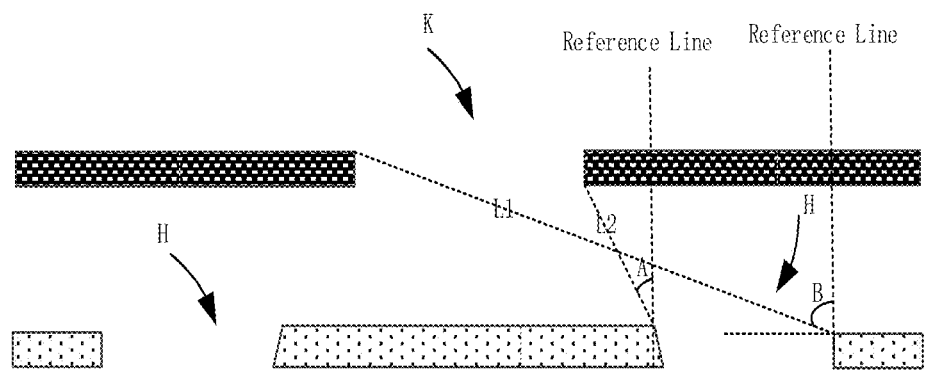
FIG. 4A is a sectional view of the optical structure according to one embodiment of the present disclosure.

In a possible embodiment of the present disclosure, an angle formed by a line connecting any point in the light-transmitting hole K and any point of the light-transmitting ring H and the reference line may be within a preset angle range, and the reference line may be perpendicular to the base substrate. Referring to FIG. 4A, an angle B formed by a line L1 connecting a point on an edge of the light-transmitting hole K and a point on an outer ring of the light-transmitting ring H at a different side and the reference line may be within the preset angle range, and an angle A formed by a line L2 connecting a point on an edge of the light-transmitting hole K and a pint on an inner ring of the light-transmitting ring H at a same side and the reference line may be also within the preset angle range. In other words, the optical structure may guide the light at an angle within the preset angle range toward the photosensitive surface of the photosensitive unit through the light-transmitting hole and the light-transmitting ring, and the light at an angle not within the preset angle range may pass through the light-transmitting hole and then may be shielded by the opaque region surrounded by the light-transmitting ring H.

In a possible embodiment of the present disclosure, the preset angle range may be 40° to 75°. Further, the preset angle range may be 42° to 70°. Generally speaking, an angle of the signal light totally reflected by a fingerprint is within a range of 40° to 75°, and an angle of the ambient light is usually small, such as smaller than 40°. After the ambient light passes through the light-transmitting hole K, it may be shielded by the opaque region surrounded by the light-transmitting ring H, so as to reduce the ambient light at a small angle from interfering the fingerprint recognition in the case that the transmission of the signal line is not adversely affected.

Figure 4B:
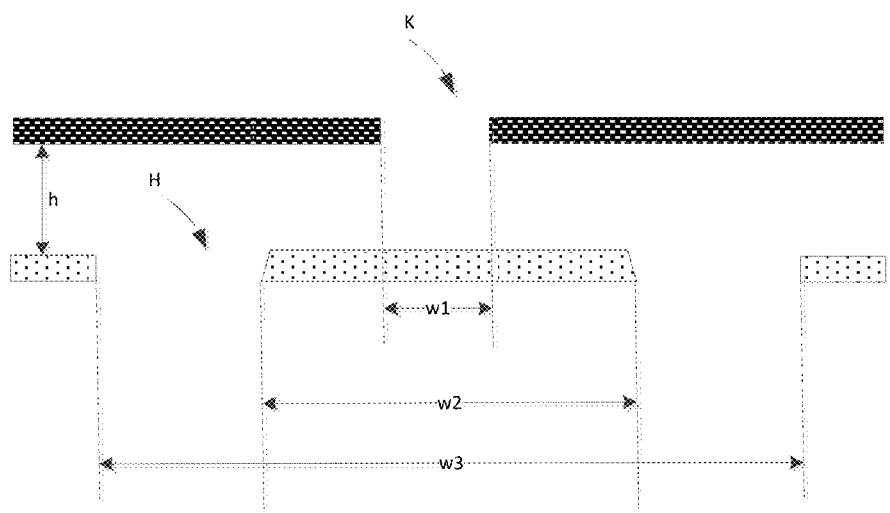
FIG. 4B is another sectional view of the optical structure according to one embodiment of the present disclosure.

In a possible embodiment of the present disclosure, referring to FIG. 4B, the light-transmitting ring and the light-transmitting hole may satisfy at least one of the following conditions: a diameter w1 of the light-transmitting hole K may be within a range of 2 µm to 20 µm, a diameter w2 of an inner ring of the light-transmitting ring H may be within a range of 5 µm to 50 µm, a diameter w3 of an outer ring of the light-transmitting ring H may be within a range of 12 µm to 300 µm, and a distance h between the light-transmitting ring and the light-transmitting hole may be within a range of 2 µm to 50 µm.

Further, the light-transmitting ring and the light-transmitting hole may satisfy the following equations:

$$\frac{\frac{w3}{2} - \frac{w1}{2}}{h1} = \tan A \text{ and } \frac{\frac{w2}{2} - \frac{w1}{2}}{h1} = \tan B,$$

where A is an upper limit of the preset angle range, such as 70°, and B is a lower limit of the preset angle range, such as 42°.

B is a critical angle of total reflection and it may depend on different film layers in a device. A is a maximum angle capable of being detected by the photosensitive unit, and it may depend on a detection capability of the photosensitive unit.

In a possible embodiment of the present disclosure, referring to FIG. 1, the photosensitive unit S includes a first electrode 107, a photosensitive layer 108 and a second electrode 109 sequentially arranged in a direction away from the base substrate 101. The first electrode 107 may be an opaque electrode and made of a metal material. The second electrode 109 may be a transparent electrode and made of indium tin oxide (ITO) or the like, so that the light may pass through the second electrode 109 and reach the photosensitive layer 108. The photosensitive unit S may be a PIN diode or any other photosensitive element.

Referring to FIG. 1, in the embodiments of the present disclosure, apart from the photosensitive unit and the optical structure, each fingerprint recognition unit may further include a thin film transistor T configured to drive the photosensitive unit. The thin film transistor T may include a gate electrode 102, a gate insulation layer 103, an active layer 104, a source electrode 1052 and a drain electrode 1051. The source electrode 1052 may be coupled to the first electrode 107 of the photosensitive unit S. As shown in FIG. 2, the thin film transistor T may be of a bottom-gate structure. In some other embodiments of the present disclosure, the thin film transistor T may also be of a top-gate structure, which will not be particularly defined herein. In the embodiments of the present disclosure, the active layer 104 may be an amorphous silicon (a-si) active layer, or an oxide active layer, or a low temperature polysilicon (LTPS) active layer, which will not be particularly defined herein.

In a possible embodiment of the present disclosure, the under-screen fingerprint recognition module may further include a first insulation layer and a signal line 1131 arranged at a side of the second electrode 109 away from the base substrate 101. The signal line may be coupled to the second electrode 109 through a via hole in the first insulation layer. The signal line 1131 may be made of metal and any other opaque conductive material, such as molybdenum. The signal line may be a bias voltage line. In a possible embodiment of the present disclosure, the signal line 1131 and the first light-shielding layer 113 may be arranged at a same layer and made of a same material, so it is unnecessary to provide the first light-shielding layer separately, thereby to reduce the quantity of masks, the manufacture cost and a thickness of the under-screen fingerprint recognition module. In the embodiments of the present disclosure, the first insulation layer may be of a single-layered or multi-layered structure. As shown in FIG. 3, the first insulation layer may include a second passivation layer 110, a resin layer 111 and a third passivation layer 112.

It should be appreciated that, in the above embodiments of the present disclosure, in order not to increase the quantity of the masks and a processing complexity, a method for changing the signal line has been adopted. In fact, in order to form the light-transmitting ring, an additional conductive or insulating film layer may also be introduced, as long as light is not allowed to pass therethrough.

In a possible embodiment of the present disclosure, the under-screen fingerprint recognition module may further include a light-transmitting shielding layer 115 arranged at a side of the photosensitive unit S away from the base substrate 101. The second light-shielding layer 116 may be arranged at a side of the light-transmitting shielding layer 115 away from the base substrate 101.

In the embodiments of the present disclosure, the second light-shielding layer 116 may be made of a conductive material or insulating material.

In a possible embodiment of the present disclosure, the second light-shielding layer 116 may be made of a conductive material and superimposed on the light-transmitting shielding layer 115, so as to form a composite electromagnetic-shielding layer, thereby to improve an electromagnetic-shielding effect while forming the light-transmitting hole K.

In a possible embodiment of the present disclosure, an insulation protection layer (not shown) may be further arranged at a side of the second light-shielding layer 116 away from the light-transmitting shielding layer 115. The insulation protection layer may be, for example, made of silicon nitride, silicon oxide, or organic glue.

Figure 5:
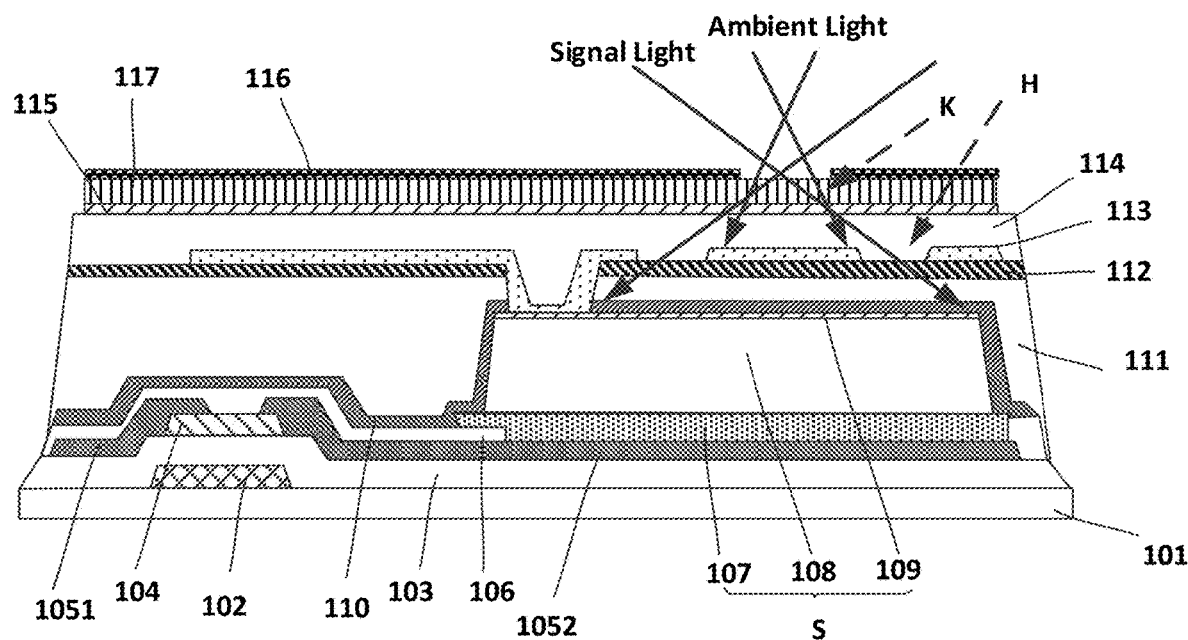
FIG. 5 is another schematic view showing the film layers of the under-screen fingerprint recognition module according to one embodiment of the present disclosure.

Apart from a case where the second light-shielding layer 116 is superimposed on the light-transmitting shielding layer 115, referring to FIG. 5, a second insulation layer 117 may also be arranged between the second light-shielding layer 116 and the light-transmitting shielding layer 115, so as to adjust a distance between the light-transmitting hole K and the light-transmitting ring H according to the practical need. The second insulation layer 117 may be made of an inorganic material or an organic material.

Figure 10:
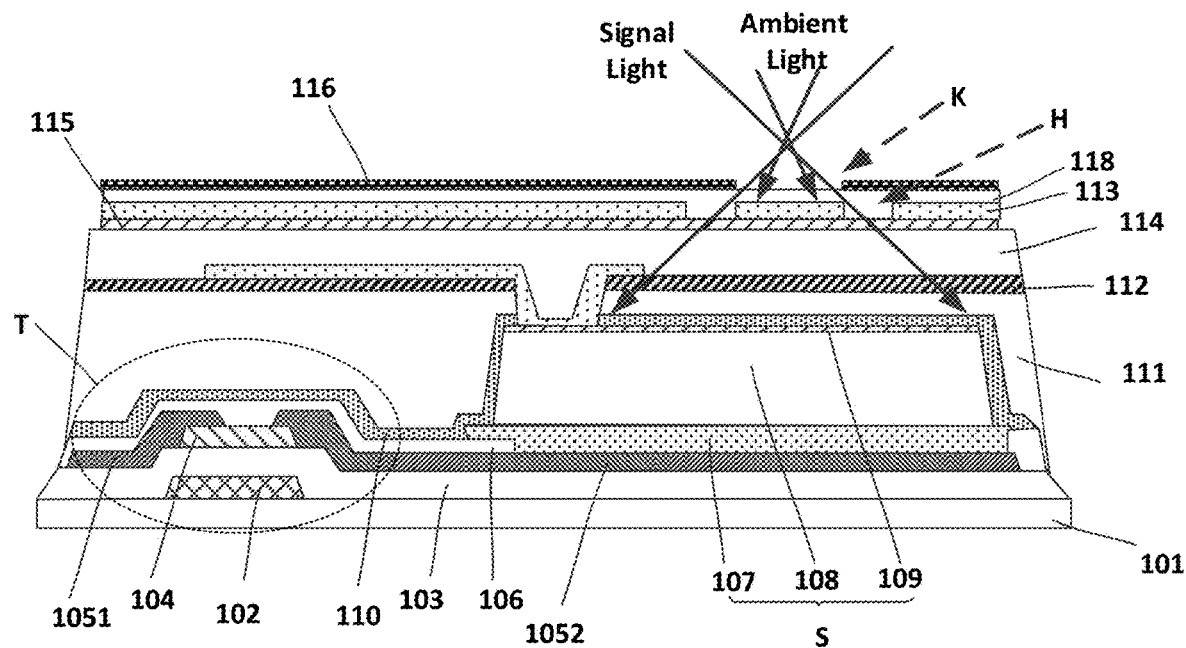
FIG. 10 is yet another schematic view showing the film layers of the under-screen fingerprint recognition module according to one embodiment of the present disclosure.

According to the embodiments of the present disclosure, it is able to prevent the interference caused by the ambient light and provide the optical structure in the fingerprint identification module, so as to simplify a collimation structure between the display substrate and the fingerprint recognition module in the related art, and reduce one optical clear adhesive layer when attaching the display substrate to the fingerprint recognition module, thereby to reduce a thickness of the module. In some embodiments of the present disclosure, the above optical structure may also be realized without any change in the film layers of the fingerprint recognition module, and instead, the optical structure may be directly arranged at a side of the fingerprint recognition module furthest from the base substrate 101, that is, an outermost side of the fingerprint recognition module, so as to simplify the manufacturing process. As shown in FIG. 10, the optical structure may include the first light-shielding layer 113 the second light-shielding layer 116, and the third insulation layer 118 arranged between the first light-shielding layer 113 and the second light-shielding layer 116. The first light-shielding layer 113 may be provided with the light-transmitting ring H, and the second light-shielding layer 116 may be provided with the light-transmitting hole K.

Figure 11:
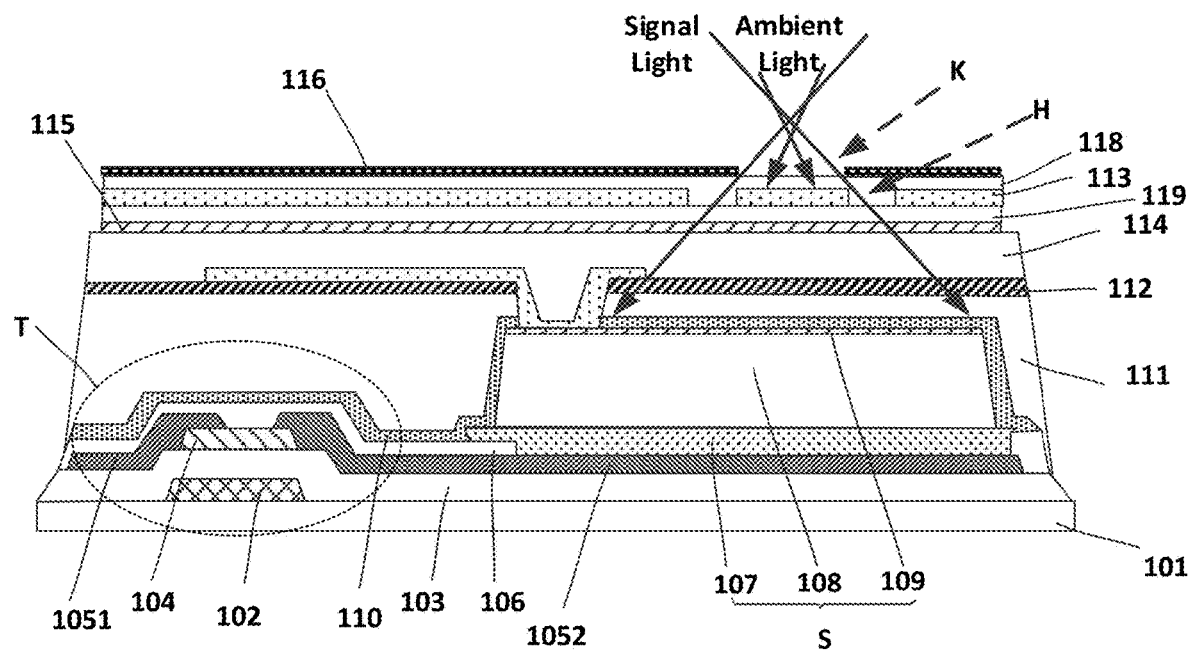
FIG. 11 is still yet another schematic view showing the film layers of the under-screen fingerprint recognition module according to one embodiment of the present disclosure.

In some other embodiments of the present disclosure, the optical structure may also be an independent component, and it may be attached to a side of the photosensitive surface of the photosensitive unit through an optical clear adhesive. As shown in FIG. 11, the optical the is an independent component which includes the first light-shielding layer 113, the second light-shielding layer 116, and a third insulation layer 118 arranged between the first light-shielding layer 113 and the second light-shielding layer 116. The first light-shielding layer 113 may be provided with the light-transmitting ring H, and the second light-shielding layer 116 may be provided with the light-transmitting hole K. The optical the may be attached to the photosensitive surface of the photosensitive unit through an optical clear adhesive 119.

Figure 6:
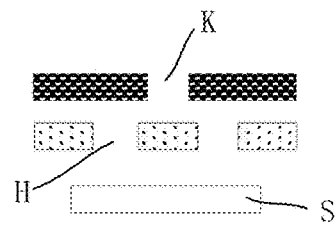
FIG. 6 is a sectional view of a fingerprint recognition unit according to one embodiment of the present disclosure.
Figure 7:
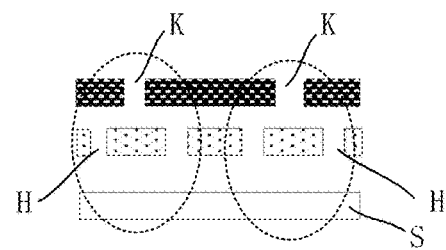
FIG. 7 is another sectional view of the fingerprint recognition unit according to one embodiment of the present disclosure.

As shown in FIG. 6, in a possible embodiment of the present disclosure, the optical structure corresponding to each photosensitive unit S may include a group of light-transmitting rings H and light-transmitting holes K. Of course, in some other embodiments of the present disclosure, the optical structure corresponding to each photosensitive unit S may also include a plurality of groups of light-transmitting rings H and light-transmitting holes K. Referring to FIG. 7, a group of light-transmitting rings H and light-transmitting holes K are surrounded by a dotted box.

Figure 8:
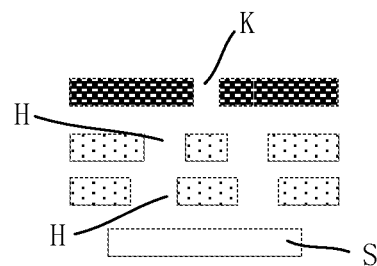
FIG. 8 is yet another sectional view of the fingerprint recognition unit according to one embodiment of the present disclosure.

In the embodiments of the present disclosure, each group of light-transmitting rings H and light-transmitting holes K may include one light-transmitting ring H and one light-transmitting hole K. Of course, in some other embodiments of the present disclosure, each group of light-transmitting rings H and light-transmitting holes K may include a plurality of light-transmitting rings H and one light-transmitting hole K, and the plurality of light-transmitting ring H may be sequentially arranged in the direction away from the photosensitive unit S, referring to FIG. 8. In a possible embodiment of the present disclosure, in the direction away from the photosensitive unit S, sizes of light-transmitting regions surrounded by the plurality of light-transmitting rings in a same group may gradually decrease, so as to control an angle of the light in a more accurate manner.

A film layer structure of the fingerprint recognition module will be illustratively described hereinafter.

Referring to FIG. 1, the fingerprint recognition module in the embodiments of the present disclosure includes: a base substrate 101 which may be flexible or rigid; a gate metal layer arranged on the base substrate 101 and including a gate electrode 102 and a gate line (not shown); a gate insulation layer 103 arranged on the gate electrode 102; an active layer 104 arranged on the gate insulation layer 103; a source/drain metal layer including a source electrode 1052, a drain electrode 1051 and a data line (not shown), the gate electrode 102, the gate insulation layer 103, the active layer 104, the source electrode 1052, the drain electrode 1051 together forming a thin film transistor T; a first passivation layer 106 arranged on the source/drain metal layer; an opaque first electrode 107 arranged on the first passivation layer 106 and couple to the source electrode 1052 through a via hole in the first passivation layer 106; a photosensitive layer 108 arranged on the first electrode 107; a transparent second electrode 109 arranged on the photosensitive layer 108, the first electrode 107, the photosensitive layer 108 and the second electrode 109 together forming a photosensitive unit S; a second passivation layer 110 covering an upper surface and a side surface of the second electrode 109 and a side surface of the photosensitive layer 108 to protect the photosensitive layer 108 from being adversely affected in subsequent processes; a resin layer 111 for planarization; a third passivation layer 112 arranged on the resin layer 111; a signal line 1131 and a first light-shielding layer 113 arranged at a same layer and made of a same material, the first light-shielding layer 113 being provided with a light-transmitting ring H, the signal line 1131 being coupled to the second electrode 109 through a via hole penetrating through the third passivation layer 112, the resin layer 111 and the second passivation layer 109, and an orthogonal projection of the light-transmitting ring H onto the photosensitive unit S being located on the photosensitive surface of the photosensitive unit S; a buffer layer 114; a light-transmitting shielding layer 115; and a second light-shielding layer 116 provided with a light-transmitting hole K. An orthogonal projection of the light-transmitting hole K onto the light-transmitting ring H is located within an opaque region surrounded by the light-transmitting ring, and an angle formed by a line connecting any point in the light-transmitting hole K and any point of the light-transmitting ring H and a reference line is within a preset angle range. The light-transmitting hole K and the light-transmitting ring H form an optical structure to guide signal light at a large angle for fingerprint recognition toward the photosensitive surface of the photosensitive unit S through the light-transmitting hole K and the light-transmitting ring H, and ambient light at a small angle passes through the light-transmitting hole K and is shielded by the opaque region surrounded by the light-transmitting ring H. In this regard, it is able to prevent the ambient light from interfering with the photosensitive unit S, thereby to improve the accuracy of the fingerprint recognition.

A film layer structure of the fingerprint recognition module in FIG. 5 may be similar to that in FIG. 1, merely with such a difference that a second insulation layer 117 is provided between the light-transmitting shielding layer 115 and the second light-shielding layer 116.

Figure 9:
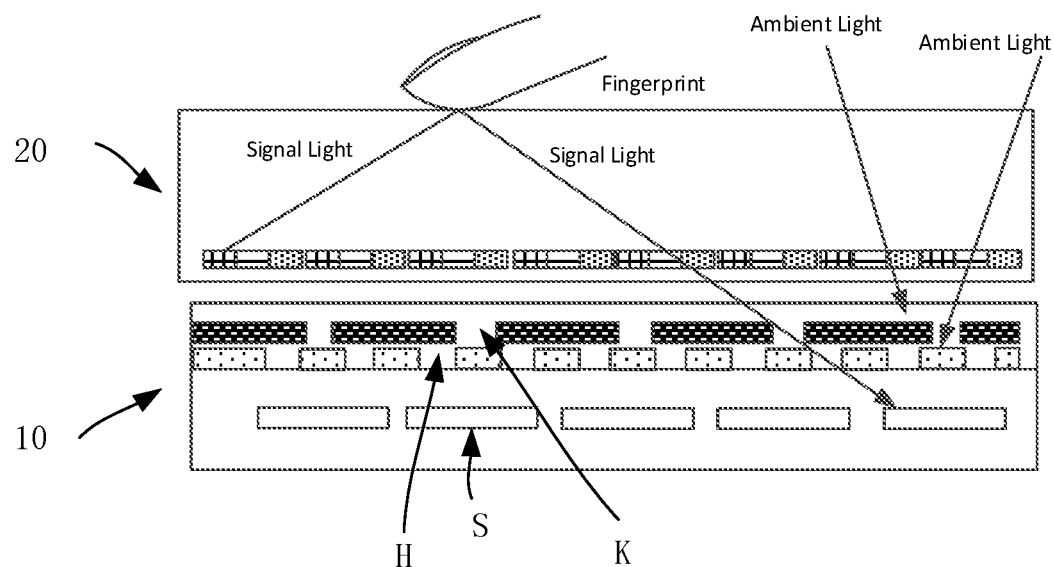
FIG. 9 is a schematic view showing a display assembly according to one embodiment of the present disclosure.

Referring to FIG. 9, the present disclosure further provides in some embodiments a display assembly which includes a display substrate 20 and the above under-screen fingerprint recognition module 10. The display substrate 20 includes a plurality of light-emitting units and is arranged at a side of the under-screen fingerprint recognition module away from the base substrate.

In the embodiments of the present disclosure, the light-emitting unit of the display substrate 20 may serve as a point light source for the fingerprint recognition module. In a possible embodiment of the present disclosure, when the display substrate 20 is clicked at a certain position, a point light source at the position may be turned on to provide light for the corresponding fingerprint recognition unit, thereby to perform the fingerprint detection.

In a possible embodiment of the present disclosure, the display substrate may be an OLED display substrate.

Further, the OLED display substrate may be flexible or rigid.

In the embodiments of the present disclosure, the display substrate may be attached to the under-screen fingerprint recognition module, e.g., through an optical clear adhesive.

In some other embodiments of the present disclosure, the display substrate and the fingerprint recognition module may be assembled in any other ways, for example, through an air cavity between the display substrate and the fingerprint recognition module, so as to improve crash resistance of the display assembly.

The present disclosure further provides in some embodiments a display device including the above display assembly.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An under-screen fingerprint recognition module, comprising a base substrate and a plurality of fingerprint recognition units arranged on the base substrate, wherein each fingerprint recognition unit comprises a photosensitive unit and an optical structure arranged on a photosensitive surface of the photosensitive unit, the optical structure comprises a light-transmitting ring and a light-transmitting hole sequentially arranged in a direction away from the photosensitive unit, the light-transmitting ring is formed in a first light-shielding layer, the light-transmitting hole is formed in a second light-shielding layer, an orthogonal projection of the light-transmitting ring onto the photosensitive unit is at least partially located on the photosensitive surface of the photosensitive unit, and an orthogonal projection of the light-transmitting hole onto the light-transmitting ring is located within an opaque region surrounded by the light-transmitting ring, wherein the light-transmitting ring and the light-transmitting hole satisfy at least one of the following conditions: a diameter of the light-transmitting hole is within a range of 2 μm to 20 μm, a diameter of an outer ring of the light-transmitting ring is within a range of 12 μm to 300 μm, a diameter of an inner ring of the light-transmitting ring is within a range of 5 μm to 50 μm, and a distance between the light-transmitting ring and the light-transmitting hole is within a range of 2 μm to 50 μm.

2. The under-screen fingerprint recognition module according to claim 1, wherein an angle formed by a line connecting any point in the light-transmitting hole and any point of the light-transmitting ring and a reference line is within a preset angle range, and the reference line is perpendicular to the base substrate.

3. The under-screen fingerprint recognition module according to claim 2, wherein the preset angle range is 40° to 75°.

4. The under-screen fingerprint recognition module according to claim 1, wherein the photosensitive unit comprises a first electrode, a photosensitive layer and a second electrode sequentially arranged in a direction away from the base substrate, and the second electrode is a transparent electrode, wherein the under-screen fingerprint recognition module further comprises a first insulation layer and a signal line arranged at a side of the second electrode away from the base substrate, the signal line is coupled to the second electrode through a via hole in the first insulation layer, and the first light-shielding layer and the signal line are made of a same material.

5. The under-screen fingerprint recognition module according to claim 1, further comprising a light-transmitting shielding layer arranged at a side of the photosensitive unit away from the base substrate, wherein the second light-shielding layer is arranged at a side of the light-transmitting shielding layer away from the base substrate.

6. The under-screen fingerprint recognition module according to claim 5, wherein the second light-shielding layer is made of a conductive material and is superimposed on the light-transmitting shielding layer.

7. The under-screen fingerprint recognition module according to claim 5, further comprising a second insulation layer arranged between the second light-shielding layer and the light-transmitting shielding layer.

8. The under-screen fingerprint recognition module according to claim 1, wherein the optical structure is an independent component attached to the photosensitive surface of the photosensitive unit through an optical clear adhesive, or arranged at a side of the under-screen fingerprint recognition module furthest away from the base substrate.

9. The under-screen fingerprint recognition module according to claim 1, wherein each optical structure comprises at least a group of light-transmitting rings and light-transmitting holes.

10. The under-screen fingerprint recognition module according to claim 1, wherein each group of light-transmitting rings and light-transmitting holes comprise at least one light-transmitting ring and one light-transmitting hole, and the light-transmitting rings are sequentially arranged in the direction away from the photosensitive unit.

11. A display assembly, comprising a display substrate and the under-screen fingerprint recognition module according to claim 1, wherein the display substrate comprises a plurality of light-emitting units and is arranged at a side of the under-screen fingerprint recognition module away from the base substrate.

12. The display assembly according to claim 11, wherein the display substrate is attached to the under-screen fingerprint recognition module.

13. A display device, comprising the display assembly according to claim 11.

14. An under-screen fingerprint recognition module, comprising a base substrate and a plurality of fingerprint recognition units arranged on the base substrate, wherein each fingerprint recognition unit comprises a photosensitive unit and an optical structure arranged on a photosensitive surface of the photosensitive unit, the optical structure comprises a light-transmitting ring and a light-transmitting hole sequentially arranged in a direction away from the photosensitive unit, the light-transmitting ring is formed in a first light-shielding layer, the light-transmitting hole is formed in a second light-shielding layer, an orthogonal projection of the light-transmitting ring onto the photosensitive unit is at least partially located on the photosensitive surface of the photosensitive unit, and an orthogonal projection of the light-transmitting hole onto the light-transmitting ring is located within an opaque region surrounded by the light-transmitting ring, wherein the photosensitive unit comprises a first electrode, a photosensitive layer and a second electrode sequentially arranged in a direction away from the base substrate, and the second electrode is a transparent electrode, wherein the under-screen fingerprint recognition module further comprises a first insulation layer and a signal line arranged at a side of the second electrode away from the base substrate, the signal line is coupled to the second electrode through a via hole in the first insulation layer, and the first light-shielding layer and the signal line are made of a same material.

15. An under-screen fingerprint recognition module, comprising a base substrate and a plurality of fingerprint recognition units arranged on the base substrate, wherein each fingerprint recognition unit comprises a photosensitive unit and an optical structure arranged on a photosensitive surface of the photosensitive unit, the optical structure comprises a light-transmitting ring and a light-transmitting hole sequentially arranged in a direction away from the photosensitive unit, the light-transmitting ring is formed in a first light-shielding layer, the light-transmitting hole is formed in a second light-shielding layer, an orthogonal projection of the light-transmitting ring onto the photosensitive unit is at least partially located on the photosensitive surface of the photosensitive unit, and an orthogonal projection of the light-transmitting hole onto the light-transmitting ring is located within an opaque region surrounded by the light-transmitting ring, wherein the under-screen fingerprint recognition module further comprises:

a light-transmitting shielding layer arranged at a side of the photosensitive unit away from the base substrate, wherein the second light-shielding layer is arranged at a side of the light-transmitting shielding layer away from the base substrate;

a second insulation layer arranged between the second light-shielding layer and the light-transmitting shielding layer.

* * * * *